United States Patent [19]

Klass et al.

[11] Patent Number: 4,818,900

[45] Date of Patent: Apr. 4, 1989

[54] PREDECODE AND MULTIPLEX IN ADDRESSING ELECTRICALLY PROGRAMMABLE MEMORY

[75] Inventors: Jeffrey M. Klass, Rosenberg; Paul A. Reed; Isam Rimawi, both of Houston, all of Tex.

[73] Assignee: Texas Instruments Incorporated, Dallas, Tex.

[21] Appl. No.: 383,637

[22] Filed: Jun. 1, 1982

Related U.S. Application Data

[63] Continuation of Ser. No. 118,348, Feb. 4, 1980, abandoned.

[51] Int. Cl.$^4$ .......................................... H03K 17/687
[52] U.S. Cl. .................................. 307/450; 307/468; 307/581; 307/449; 365/230; 341/102
[58] Field of Search ............... 340/347 DD; 365/230, 365/226, 227; 307/463, 443, 445, 448–450, 464–465, 468, 473, 572, 581, 584, 304

[56] References Cited

U.S. PATENT DOCUMENTS

| | | | |
|---|---|---|---|
| 3,381,270 | 4/1968 | Huffman | 340/347 DD |
| 3,440,646 | 4/1969 | Dean | 340/347 DD |
| 3,539,823 | 11/1970 | Zuk | 340/347 DD |
| 3,851,186 | 11/1974 | Koo | 340/347 DD |
| 4,104,735 | 8/1978 | Hofmann | 307/463 |
| 4,143,359 | 3/1979 | Beelitz | 340/347 DD |

*Primary Examiner*—David Hudspeth
*Attorney, Agent, or Firm*—William E. Hiller; N. Rhys Merrett; Melvin Sharp

[57] ABSTRACT

An electrically programmable memory array having rows and columns of floating gate type memory cells employs alternate output lines and ground lines between the columns of cells, providing a virtual ground arrangement. A row is selected by one part of an address input, and a column selected by another part. An output line on one side of the selected column is activated, and a ground line on the other side. A differential sense amplifier is responsive to the voltage on the selected output line and a reference voltage. The number of transistors needed in the decoder for the row select function is greatly reduced by employing predecoders which perform a 1-of-4 select for each pair of address bits, then using one of these select outputs to activate N multiplexers, and all the others as inputs to a decoder with N outputs to the multiplexers.

16 Claims, 14 Drawing Sheets

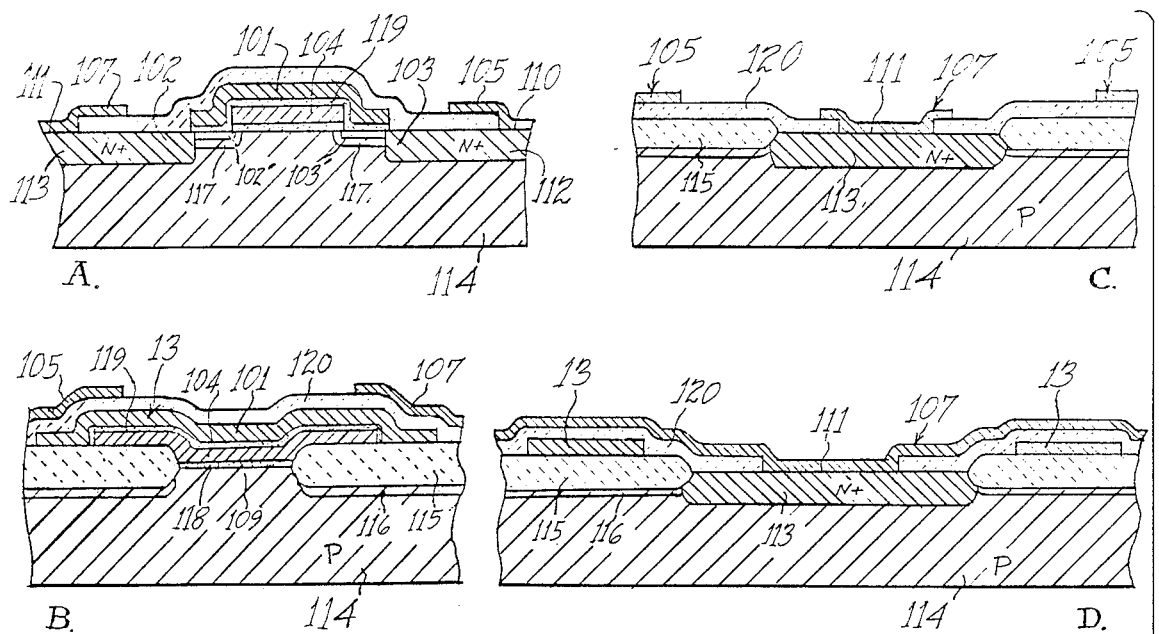
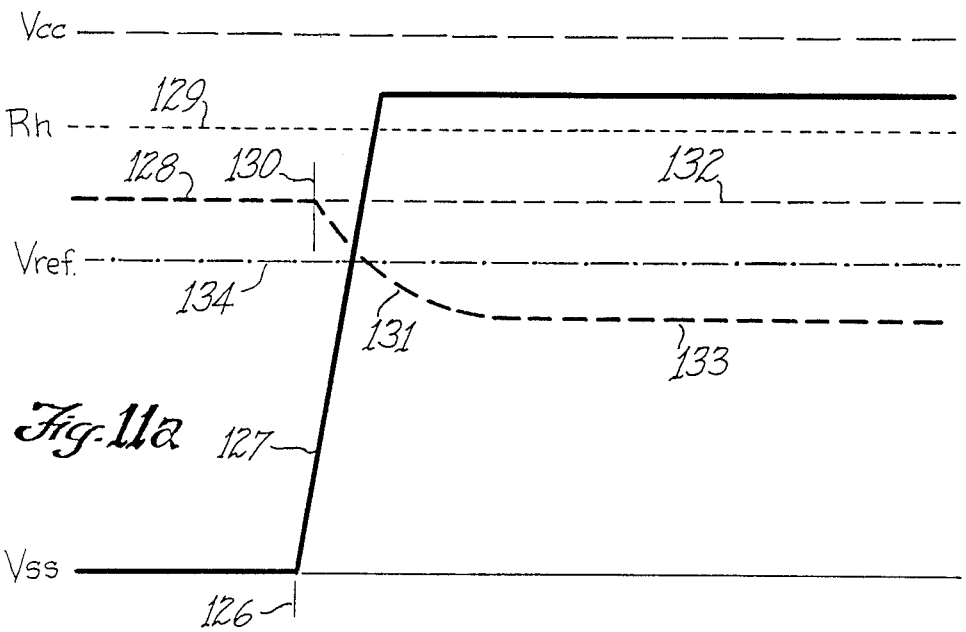
Fig. 10
Fig. 11a

PREDECODE AND MULTIPLEX IN ADDRESSING ELECTRICALLY PROGRAMMABLE MEMORY

RELATED CASES

This is a continuation of application Ser. No. 118,348 filed Feb. 4, 1980, now abandoned. This continuation application contains subject matter disclosed in copending application filed Feb. 4, 1980 concurrently with parent application Ser. No. 118,348, now abandoned, and including Ser. No. 118,287, now U.S. Pat. No. 4,314,362 issure Feb. 2, 1982; Ser. No. 118,288, now U.S. Pat. No. 4,344,154 issued Aug. 10, 1982; Ser. No. 118,349 now U.S. Pat. No. 4,387,447 issued June 7, 1983; and Ser. No. 118,350, now abandoned; Ser. No. 088,789, filed Oct. 29, 1979, by J. A. Neal and P. A. Reed, now U.S. Pat. No. 4,281,397 issued July 28, 1981, and Ser. No. 090,381, filed Nov. 1, 1979, by J. M. Klaas, now U.S. Pat. No. 4,301,518 issued Nov. 17, 1981, all assigned to Texas Instruments.

BACKGROUND OF THE INVENTION

This invention relates to semiconductor memory devices and more particularly to MOS read-only type memories of the electrically programmable type.

Floating gate type electrically programmable read-only memory or EPROM devices are usually manufactured using cell layouts as seen in U.S. Pat. Nos. 4,112,509 and 4,112,544, issued to Wall and McElroy, assigned to Texas Instruments, or in U.S. Pat. Nos. 3,984,822. Several manufacturers produce EPROM devices of layout such as this in 8K, 16K, 32K and more recently 64K bit sizes. The continuing demand for higher speed and lower cost, however, requires reduction in cell size or increase in bit density while at the same time maintaining process compatability with existing double-level polysilicon N-channel manufacture. One of the classic techniques for increasing the array density in read-only type memories is the use of a virtual ground configuration instead of providing a ground line for each column or output line. Virtual ground memories are disclosed in U.S. Pat. No. 3,934,233 issued to Fisher and Rogers or U. S. Pat. No. 4,021,781 issued to E. R. Caudel, both assigned to Texas Instruments. A virtual ground EPROM layout is shown in U.S. Pat. No. 4,151,021, issued to David J. McElroy, assigned to Texas Instruments. The high voltage transients and high currents required in programming of floating gate EPROMs place more stringent demands on the decode circuitry than on the circuits previously employed in virtual ground devices. For this reason, prior EPROM layouts used separate contacts and lines to each cell, which unfortunately required excess space on the clip. However, when separate ground select and column select functions are used, as needed for operation of a virtual ground memory, the column decode employed is of different complexity compared to dedicated ground type memory devices. This column and ground select addressing, as well as row addressing for large, high speed devices, imposes new requirements on decode circuitry. The demand by customers for low power operation of EPROM devices hs necessitated implementation of a power-down mode different from the usual standby mode of operation. In the power-down mode the EPROM device will not respond to an address, yet when exiting from power-down there must not be an unduly long period before normal access is permitted. It is within constraints and often conflicting requirements that improved EPROMS are being designed.

It is the principal object of this invention to provide an improved electrically programmable read only memory device, particularly one which is of smaller size or greater bit density. Another object is to provide an improved electrically programmable memory device which is of low power dissipation or is capable of power-down operation. A further object is to provide an arrangement for accessing a memory array for read and/or programming in an improved manner.

SUMMARY OF THE INVENTION

In accordance with one embodiment of the invention, an electrically programmable memory array having rows and columns of floating gate type memory cells employs alternate output lines and ground lines between the columns of cells, providing a virtual ground arrangement. A row is selected by one part of an address input, and a column selected by another part. An output line on one side of the selected column is activated, and a ground line on the other side. A differential sense amplifier is responsive to the voltage on the selected output line and a reference voltage. The number of transistors needed in the decoder for the row select function is greatly reduced by employing predecoders which perform a 1-to-4 select for each apir of address bits, then using one of these select outputs to activate N multiplexers, and all the others as inputs to a decoder with N outputs to the multiplexers.

The predecoders are AND/OR circuits which receive two pairs of true and complement address voltages for each address bits; each pair includes address voltages which are logically the same but separated by a low-threshold transistor. The predecode circuit is speeded up by using the higher of each pair to drive the input transistors of the AND/OR circuits between Vcc and output nodes, while using the lower of each pair to drive input transistors of the AND/OR circuit between output nodes and ground. The former input transistors have lower capacitive loading than the latter.

BRIEF DESCRIPTION OF THE DRAWINGS

The novel features believed characteristics of the invention are set forth in the appended claims. The invention itself, however, as well as other features and advantages thereof, will be best understood by reference to the detailed description which follows, read in conjunction with the accompanying drawings, wherein:

FIGS. 10A-10D are elevation views in section of the cells of FIG. 9, taken along the lines A—A,B—B,C—C and D—D in FIGURE 9.

DETAILED DESCRIPTION OF SPECIFIC EMBODIMENT

The Memory System

Figure 1:
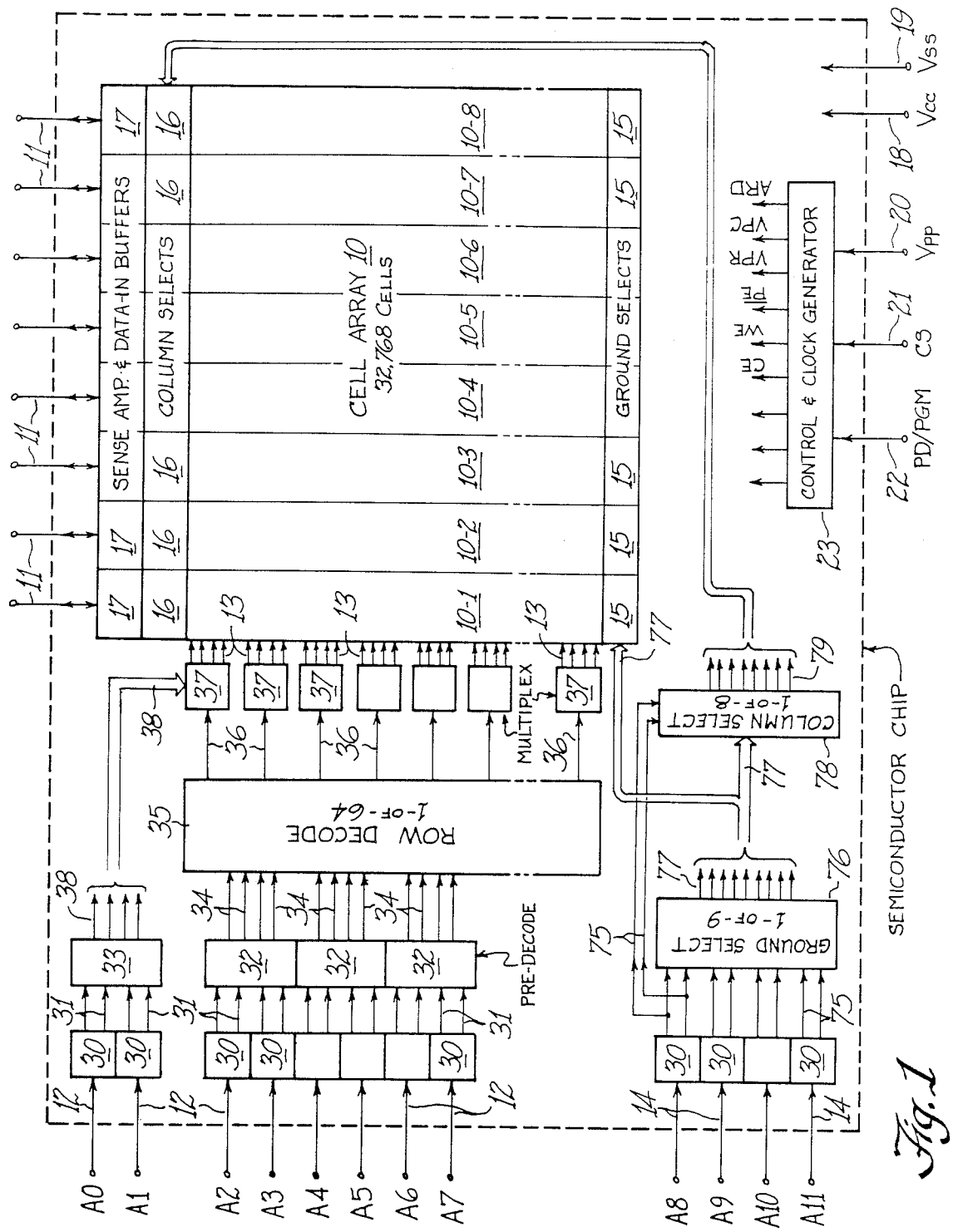
FIG. 1 is an electrical diagram in block form of a semiconductor memory device of the floating gate EPROM type using features of the invention.

Referring to FIG. 1, a memory system using features of the invention is shown in block diagram form. Although the invention may be used in memory devices of various types and sizes, the example shown here is an electrically programmable read-only memory of EPROM of the N-channel floating gate type having 32K or 32,768 bits, partitioned 8×16×256. In commercial embodiments, additional column decoding would be provided to define a 16K bit device partitioned 8×32×64 instead of 8×8×256, while a 32K bit would be partitioned 8×32×128 gand a 64k bit device partitioned 8×32×256; the embodiment shown was chosen to illustrate the advantages of the row decode circuitry. In FIG. 1, a cell array 10 contains 32,768 floating gate memory cells arranged in 256 rows and 128 columns, with the columns split into eight separate groups of cells 10-1 through 10-8. Each group has a separate input/output terminal 11. An eight-bit row address applied to eight address input terminals 12 is decoded to actuate only one of 256 row lines 13. The cell array is of a virtual ground type wherein only one ground line is coupled to ground in each of the groups 10-1 to 10-8, while an adjacent column line is used as an output for the selected cell in each group. A four-bit column address applied to the integrated circuit device by four terminals 14 is decoded to select one of nine ground lines in each group 10-1 to 10-8 by eight separate select circuits 15, and to select one of eight output column lines by eight separate select circuits 16. A different sense amplifier 17 for each group 10-1 to 10-8 senses the data bit for the selected cell and applies an output to one of the terminals 11 for read operation; for program operations a data bit on a terminal 11 is applied to the selected bit in each group by an input buffer in circuitry 17 and the select circuit 16.

The integrated circuit device in this example has five other terminals in addition to the eight data terminals and twelve address terminals. A single +5 V supply Vcc is applied by a terminal 18, with ground or Vss on terminal 19. A programming voltage Vpp of about +25 v is applied at a terminal 20. A chip select command $\overline{CS}$ is applied at a terminal 21, and a power-down/program command PD/$\overline{PGM}$ applied at a terminal 22. The latter three, Vpp, $\overline{CS}$ and PD/$\overline{PGM}$, are connected to a control circuit 23 which generates control voltages to define the operating mode of the system.

System Operating Modes

In the read mode, Vpp and PD/$\overline{PGM}$ are at logic 0 and $\overline{CS}$ is active low, logic 0. These conditions are seen in FIGS. 2a-2e, left-hand side. With $\overline{CS}$ low as in FIG. 2a and Vpp and PD/$\overline{PGM}$ low as in FIGS. 2d and 2c, when the twelve address bits A0-A11 on the terminals 12 and 14 come valid at time 24 in FIG. 2b, eight bits in the array 10 are selected (one in each of the groups 10-1 to 10-8) and these eight bits appear on the terminals 11 as seen in FIG. 2e.

Another condition is a standby mode where all inputs are the same as in the read mode except that $\overline{CS}$ is high, at logic 1. Here the chip is in a read condition but is not selected so when an address occurs as in FIG. 2b, center, no data out of FIG. 2e results.

A power-down mode of operation occurs when the PD/$\overline{PGM}$ input is logic 1 as seen in FIG. 2c, right-hand side. Vpp is low, as in FIG. 2d; $\overline{CS}$ can be low or high, i.e., is a don't care condition. If an address occurs, no output is produced.

Figure 2:
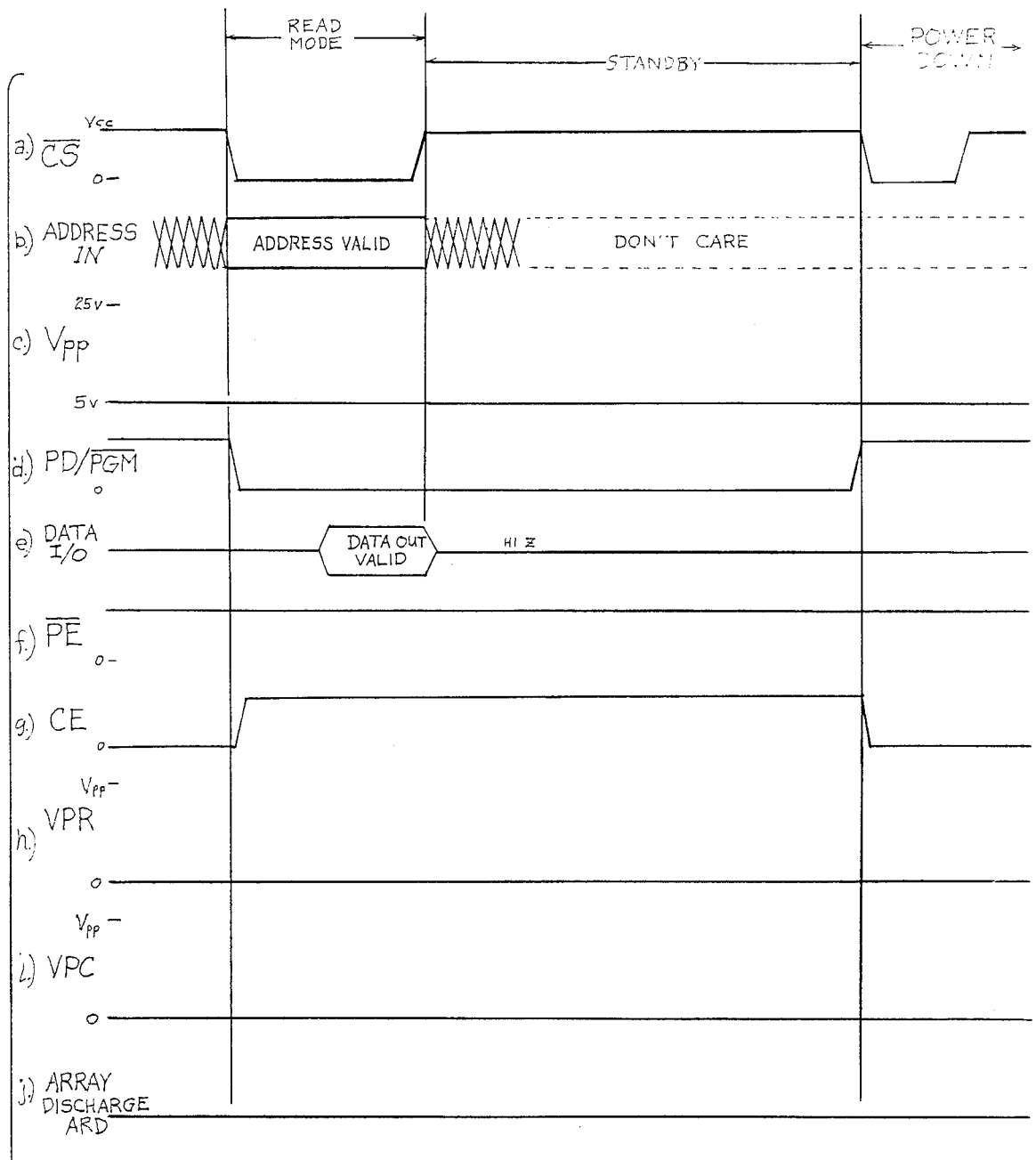
FIGS. 2 and 2' are a timing diagram showing voltage as a function of time for various points in the device of FIG. 1.
Figure 2:
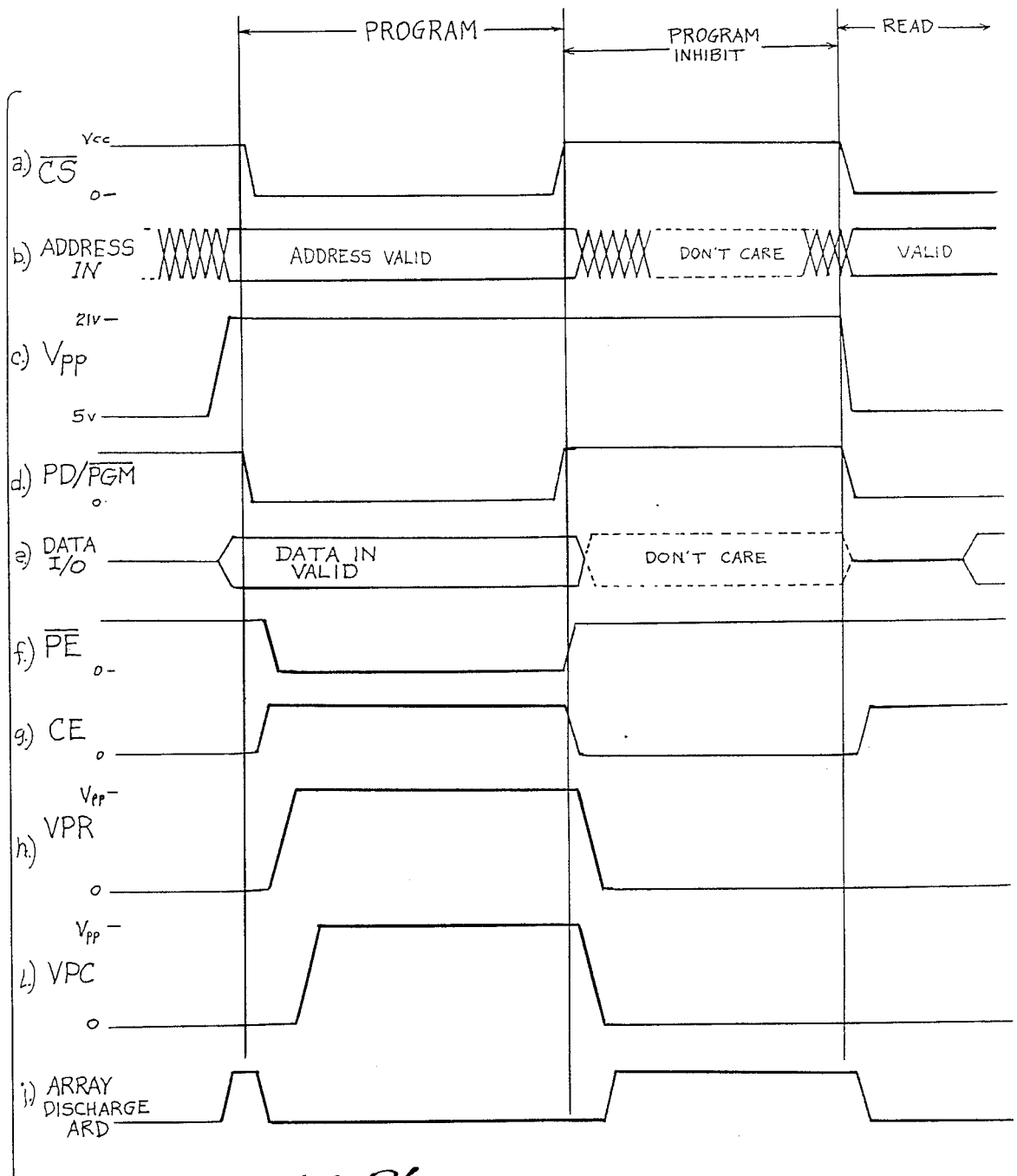

The programming mode of operation occurs when the Vpp input is at +25 V as seen in FIG. 2'd (left-hand side), PD/$\overline{PGM}$ is active low as in FIG. 2'e, and $\overline{CS}$ is active low as in FIG. 2'a. In this condition, a row address applied to the terminals 12 produces a high voltage (Vpp-Vt) on one of the row lines 13 (all other low). A column address on terminals 14 occurring as seen in FIG. 2'b selects one column of eight in each group. Either a high voltage Vpp-Vt or low voltage is applied to the selected column line for each of the eight selected bits in the groups 10-1 to 10-8, depending upon whether a 0 or a 1 is present on each of the terminals 11 during the time seen in FIG. 2'e. This condition causes the floating gates of the eight selected bits to be charged or not, depending upon the data input on terminals 11.

When Vpp is high, only a condition of both $\overline{CS}$ and PD/$\overline{PGM}$ low produces a program mode. All other conditions produce a program inhibit mode as seen in the right-hand side of FIGURE 2'. When either or both of the inputs $\overline{CS}$ or PD/$\overline{PGM}$ are high as seen in FIG. 2'a or 2'c, an inhibit mode exists. Here, regardless of addresses occuring on terminals 12 and 14 or data present on the terminals 11, the chip is in a power-down mode.

The Row Select Circuits

The row select circuitry in the system of FIG. 1 includes predecode and multiplex features which provide significant advantages. Each of the eight row address bits A0-A7 on the terminals 12 is applied to one of eight buffer circuits 30, each of which produces address and complement voltages A and $\overline{A}$ on lines 31 going to predecoders 32 for bits A2 to A7 or to a row-shared decoder 33 for bits A0 and A1. Three of the predecoders 32 are used for six address bits A2 to A7, and each of these circuits produces four outputs on lines 34 which are inputs to a one-of-64 row decoder 35. The decoder 35 has sixty-four output lines 36, only one of which is high for a given address A2-A7; all others are low. The lines 36 are separately applied to sixty-four one-of-four selector circuits 37, each of which has four outputs 13 that are the row lines for the array 10 and extend through all eight groups 10-1 to 10-8. Each of the selectors 37 receives four input lines 38 from the row-shared decoder 33 and functions to select one of the four lines 13 depending upon the A0 and A1 bits of the address.

Figure 3:
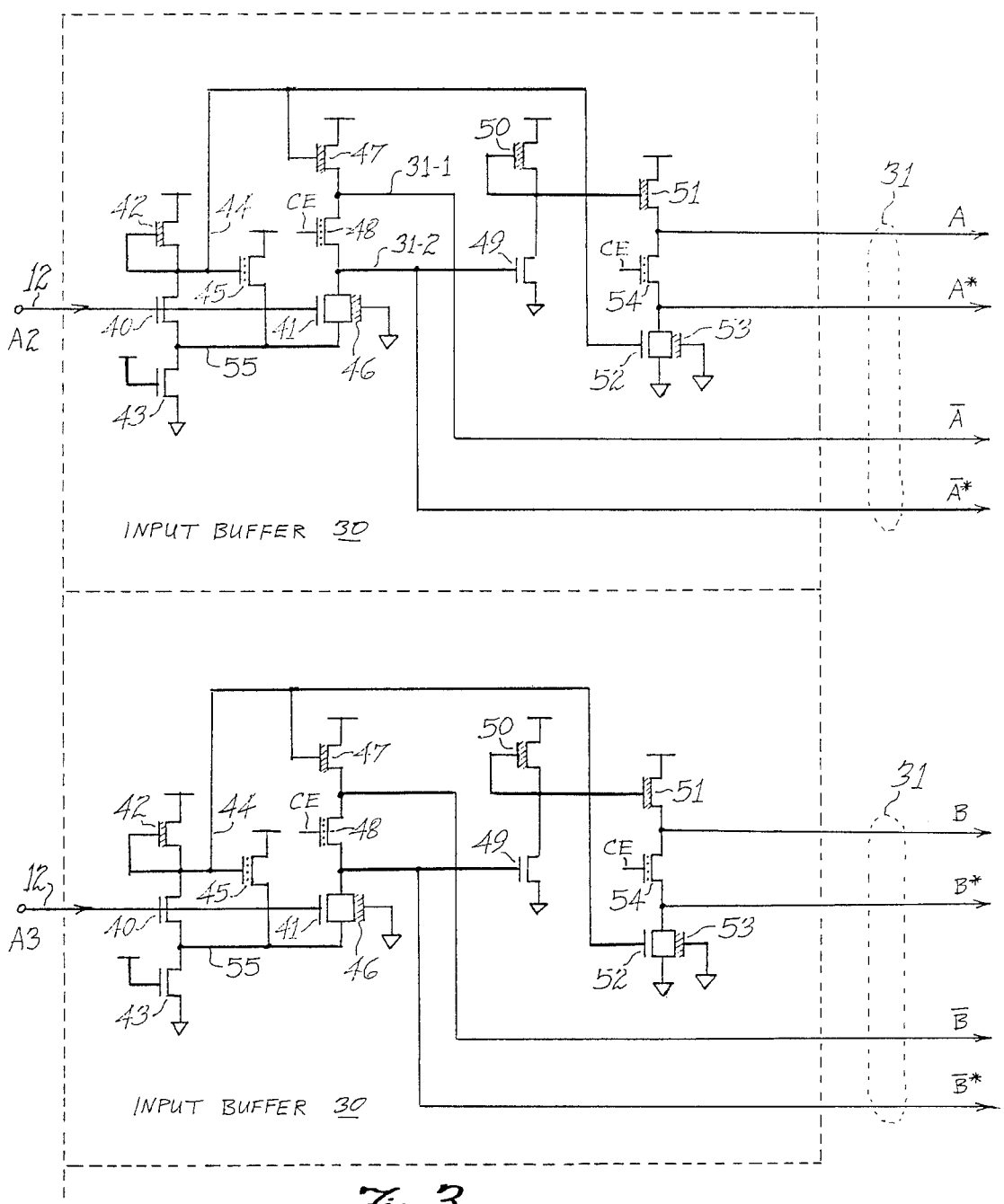
FIG. 3 is an electrical schematic diagram of input buffers used in the device of FIG. 1.

Referring to FIG. 3 where two of the buffer circuits 30 are shown in detail in schematic diagram form, an input terminal 12 is connected to the gates of two enhancement transistors 40 and 41. The first input transistor 40 has a depletion load 42, and is connected to ground through a transistor 43 having its gate at Vcc. The output 44 of the first stage is connected to the gate of a natural transistor 45 which shares the grounding transistor 43, as does the second input transistor 41 and its parallel grounded-gate depletion transistor 46. Thus, current for all the transistors 40,41,45 and 46 flows through the transistor 43. The node 44 is also connected to the gate of a depletion transistor 47 in series with the input transistor 41, and a natural transistor 48 also in series with these transistors has the CE signal on its gate so it functions to provide the power-down mode. The source of the transistor 47 provides an $\overline{A}$ output line 13-1, while the drain of the transistor 41 provides an $\overline{A}*$ output line 31-2. If the input 12 is high, transistor 41 is on so $\overline{A}$ and $\overline{A}*$ are low. Another inverter transistor 49 with a depletion load 50 receives the $\overline{A}*$ signal on its gate; this inverter drives the gate of a depletion load 51 in the final stage. The output node 44 of the first inverter 40 is connected to the gate of an enhancement transistor 52 in this final stage, and this transistor has a parallel, grounded-gate, depletion mode transistor 53 like the transistor 46 for power-down operation. A natural transistor 54 with CE on its gate also provides a pulldown function during power-down like the transistor 48.

The transistor 45 is for the purpose of balancing the current through the transistor 43 between 0 and 1 inputs so the voltage on the node 55 is approximately constant. The voltage on the node 55 provides a small back bias on transistors 40 and 41; for low input levels operation is still adequate with proper TTL margins even with low Vt.

The transistors 47 and 51 have inverted outputs of prior stages on their gates to speed up operation compared to what would be exhibited for standard gate-shorted-to-source depletion loads. In this manner the gates will rise faster and the transistors 47 and 51 turn on faster than if connected to the respective sources.

In power-down operation, the transistors 48 and 54 are turned off by the CE input seen in FIG. 2f. The control circuit generates CE from $PD/\overline{PGM}$; this voltage is the complement of $PD/\overline{PGM}$. With transistors 48 and 54 off, $\overline{A}$ and A will both go high during the power-down mode; A* and $\overline{A}*$ will go low. The function of the transistors 46 and 53 is to hold the outputs $\overline{A}*$ and A* low by leakage during power-down. In the active read mode, CE is high and transistors 48 and 54 are fully conductive, so $\overline{A}$ and $\overline{A}*$ are the same logic state, as are A and A*.

Figure 4:
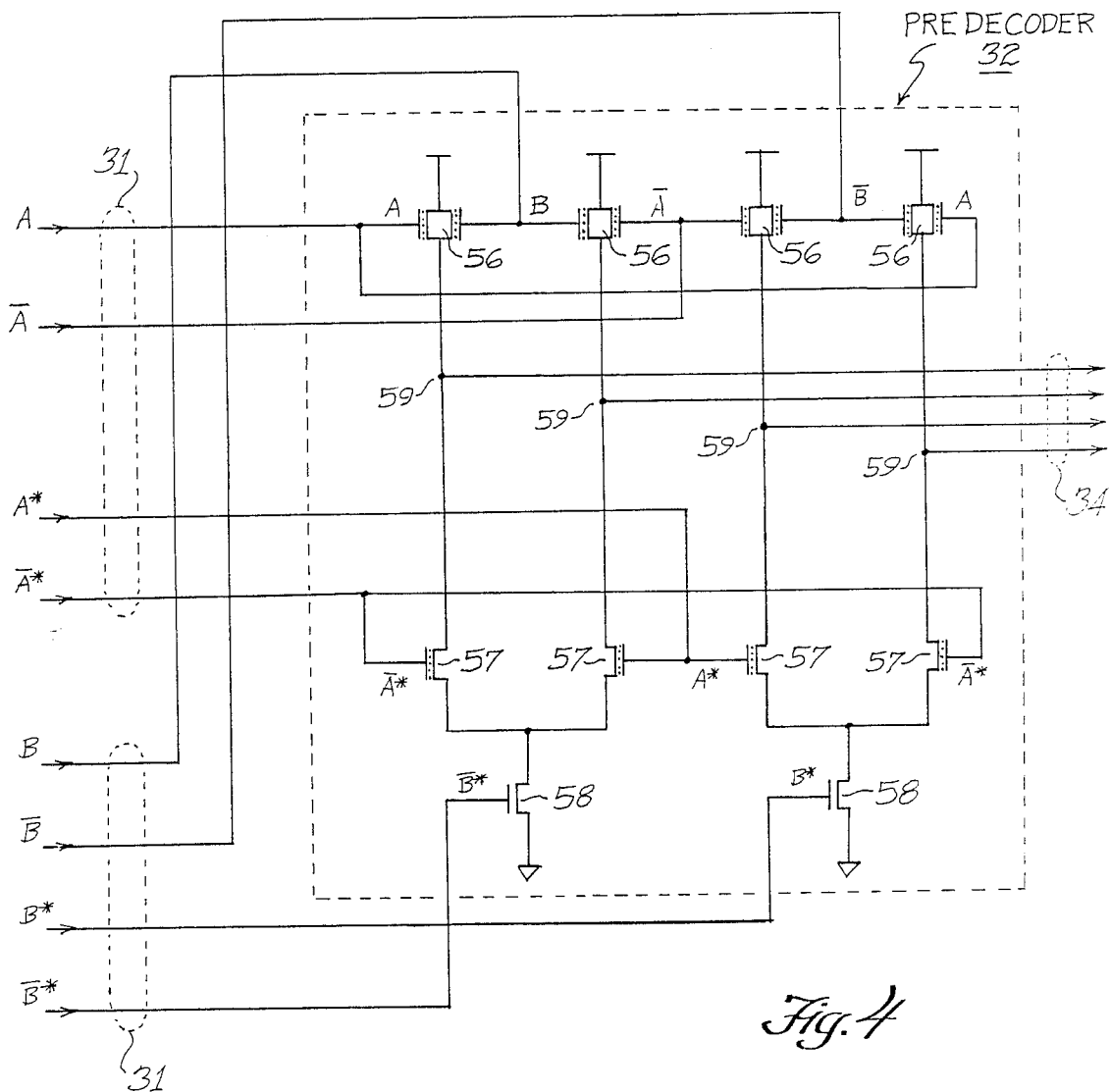
FIG. 4 is an electrical schematic diagram of a predecoder circuit used in the device of FIG. 1.

Shown in FIG. 4 is one of three predecoders 32. This circuit has four sets of parallel, low-threshold, natural transistor pairs 56 which have the A, $\overline{A}$, B and $\overline{B}$ outputs on the gates. These four parallel pairs are in series with four natural transistors 57 having A* and $\overline{A}*$ on the gates. Pairs of the transistors 57 are connected to ground through enhancement transistors 58 having $\overline{B}*$ and B on the gates. The four outputs 34 are taken at nodes 59 between the transistors 56 and transistors 57. Note that all of the A* and B* signals are below the nodes 59 and the A and B signals above; this is advantageous in power-down operation.

Figure 4A:
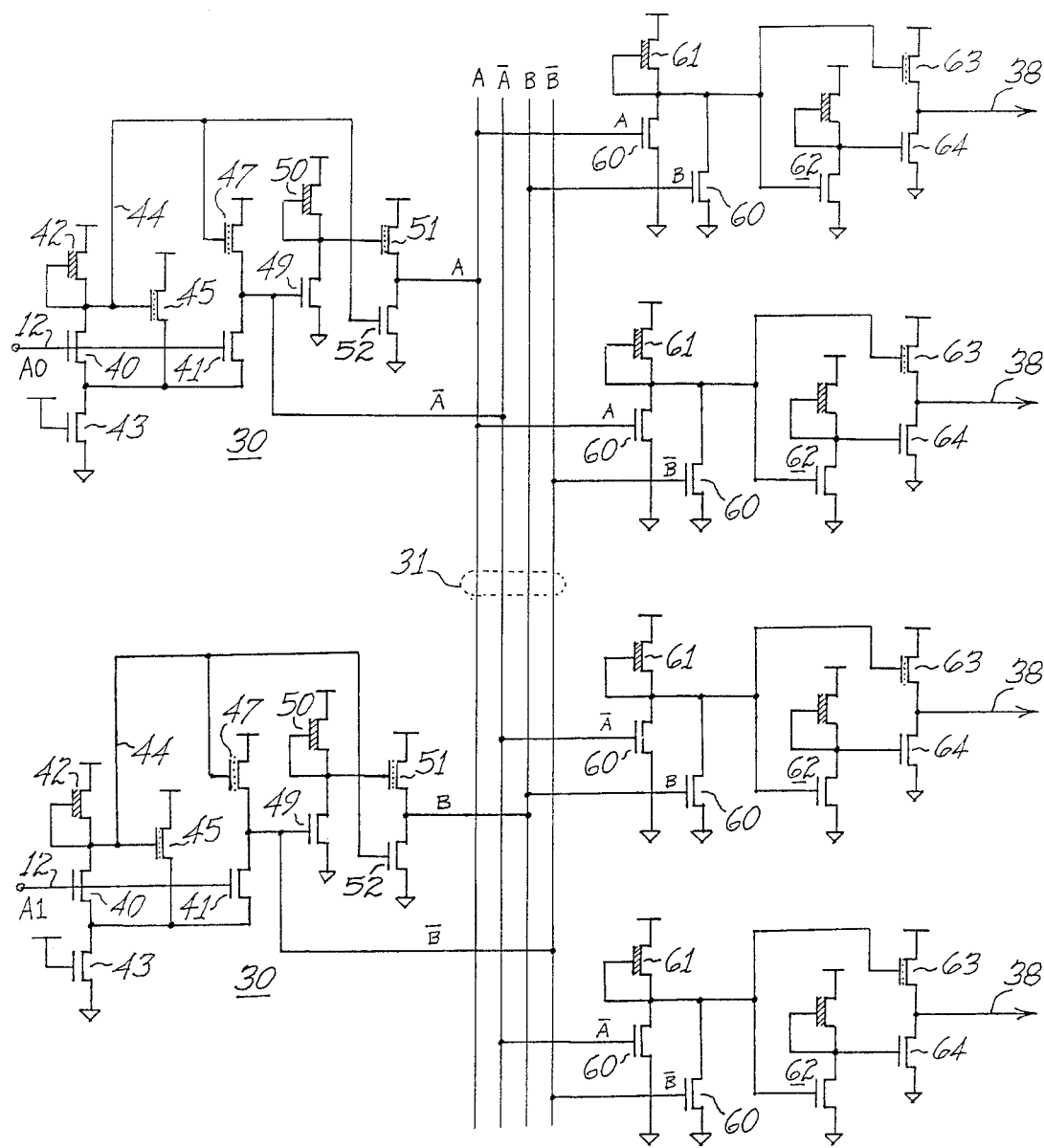

FIG. 4a shows the input buffers 30 for the A0 and A1 bits, along with the row-shared decoder 33. The input buffer circuits are the same as in FIG. 3 except that the power-down function is not used so the transistors 48 and 54 are not present and the depletion transistors 46 and 53 are omitted. No A* and B* outputs are produced.

The row-shared decoder 33 includes four NOR gates having transistors 60 with gates connected respectively to pairs of the A,$\overline{A}$,B,$\overline{B}$ outputs 31 from the buffers 30 for the A0 and A1 address bits. Each NOR has a depletion load 61 and produces one of the four outputs 38 by a push-pull output circuit having an inverter stage 62 and a push-pull transistor pair 63 and 64.

Figure 5:
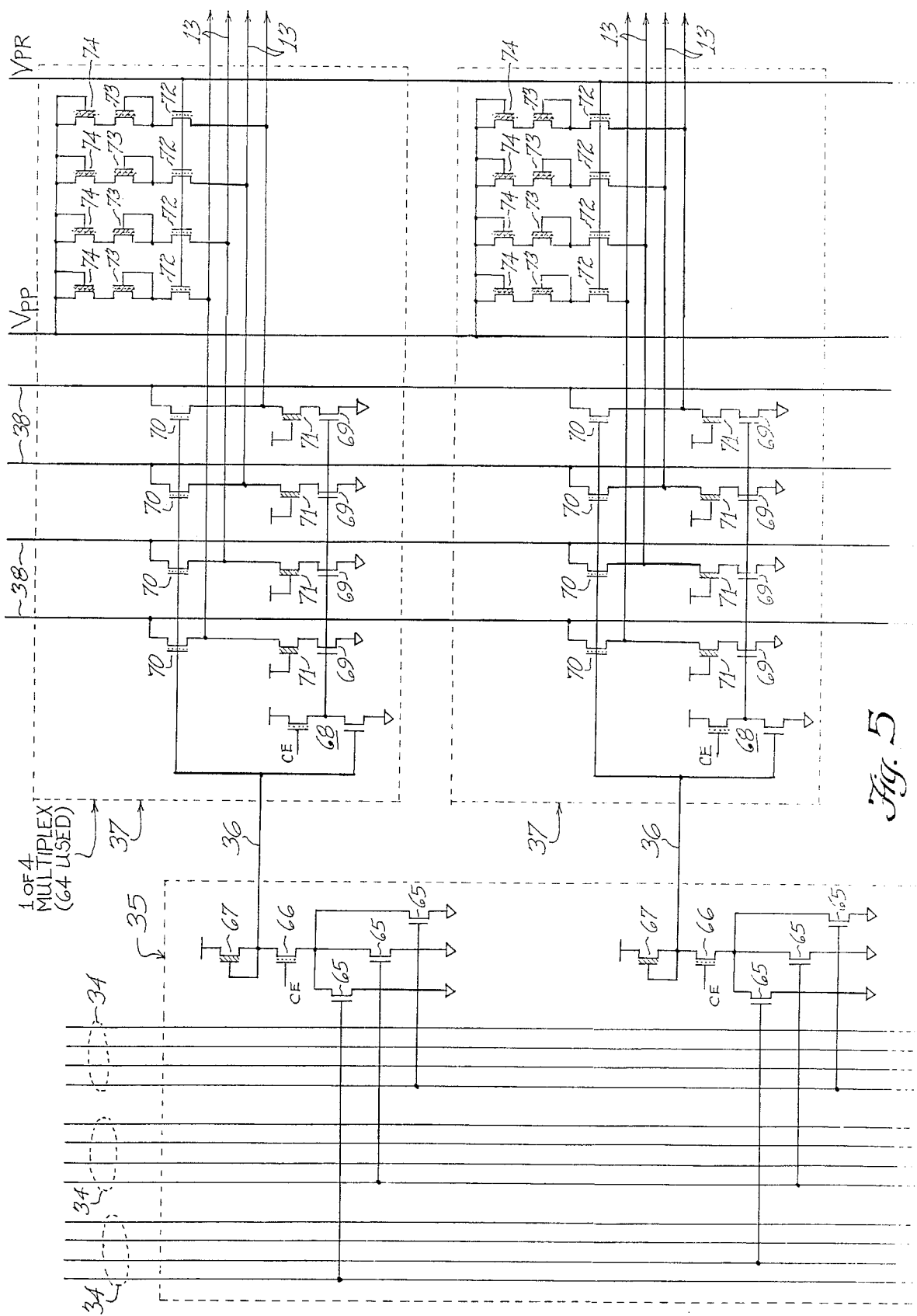
FIG. 5 is an electrical schematic diagram of a row decoder and select circuits used in the device of FIG. 1.

In FIG. 5, the one-of-64 decoder 35 is shown in detail along with the one-of-four decoders 37 and the circuits for applying programming voltage Vpp to the row lines. The three sets of four lines 34 extend along the decoder to provide inputs to the gates of three transistors 65 in each of sixty-four NOR gates. A different combination of one input from each of the three sets of lines is used in each NOR gate so only one is selected for a given code on the lines 34. The three parallel transistors are connected in series with a power-down control transistor 66 having CE on its gate and with a depletion load 67. In the power-down mode, CE is low and the transistor 66 off so output 36 is high and no current flows in any of the 3×64 or 192 transistors 65. In the normal mode CE is high and so it exhibits a very small drop because it is a natural or low thresold transistor. For the selected NOR gate all of the gates of the three transistors are low and line 36 is high; for all others at least one gate input is high so the line 36 is low. When line 36 is low, an inverter 68 in the decoder 37 produces a high output to the gates of four transistors 69 which hold low all four row lines 13 for this decoder 37. For the one line 36 which is high, a set of four transistors 70 is turned on, coupling the four lines 38 to the four row lines 13. Only one of these four lines 38 is high, so only one of the 256 row lines 13 will be high. Depletion transistors 71 having Vcc on their gates function to prevent the high voltage present during programming from destroying the driver transistors 69; these devices 71 will turn off with high voltage on their drain.

For programming, a selected one of the 256 row lines is taken near Vpp and the others held low. The Vpp input 20 is connected through sets of three series transistors 72,73,74 to each of the row lines 13. A VPR command derived from Vpp, $\overline{CS}$ and $PD/\overline{PGM}$ is connected to the gates of all of the transistors 72, so that programming is possible only if $\overline{CS}$ and $PD/\overline{PGM}$ are low and Vpp high; in any other conditions VPR is low and transistors 72 off. The transistors 73 and 74 are all non-adjusted depletion devices having a threshold of about −4 V. The effect of the series combination is to pull up to Vpp the one line 13 which is at logic 1; all others stay at Vss because the transistors 69 for all others are on.

The row decoder circuitry of FIGS. 3,4 and 5 has several advantageous features. In the address buffers 30, the slowest output, A (or B), is only two inversions (transistors 40 and 52) from the address input terminal 12, so the speed is good. Also, the use of the second input transistor 47 speeds up response to a positive going input transition. The provision of separate A and A*, $\overline{A}$ and $\overline{A}*$, etc., outputs allows the buffer to power-down in its minimum power state while at the same time puts the predecoder 32 in a zero power state. The predecoder 32 used with the row decoder 35 allows the number of driver devices 65 used in the NOR gates to be cut in half, then using one NOR gate for every four row lines 13 reduces the drivers required by two more. Thus, a one-of-256 decoder requires only sixty-four NOR gates, each with three transistors 65. Compared to the standard 256 NR gates of eight input transistors each, the reduction in loading and number of devices is very favorable. The row-shared or multiplex decoder 33 uses a simple NOR circuit with two input transistors 60 employing a push-pull output stage 63,64 for improved drive. The row decoder 35 is a three input NOR with another transistor 66 in each NOR with gate connected to CE for power-down control; CE is low for power-down.

The Column Select Circuits

Referring to FIG. 1, the column select circuitry includes four input buffers 30 which are the same as the input buffers used for the A0 and A1 address bits. The eight address and complement outputs from the four buffers on lines 75 are applied to a one-of-nine decoder 76 which activates one of nine output lines 77 going to the ground select circuits 15. One of the nine ground lines in each of the groups 10-1 to 10-8 is thus selected first, before the output column line is selected. The lines 77 are also inputs to a column select decoder 78; this decoder uses the A8 and $\overline{A8}$ outputs on two of the lines 70 as inputs to select one of the two sides for the one of nine lines 77 which is high. A one-of-eight output on lines 79 is connected to the column selectors 16.

It is important that the virtual ground select on lines 77 is decoded and available as quickly as possible for minimizing the access time. Delay can be tolerated for activating the column select on the lines 79. The time of operating the virtual ground selectors 15 has more significant impact on access time than that of operating the column selectors 16, where delay can be tolerated. Thus, the virtual ground select is decoded directly from the address inputs A8–A11 and used for activating the ground selectors 15, then the ground select on lines 77 is used in decoder 78 with the LSB of the column address, A8, to generate the column select.

Figure 6:
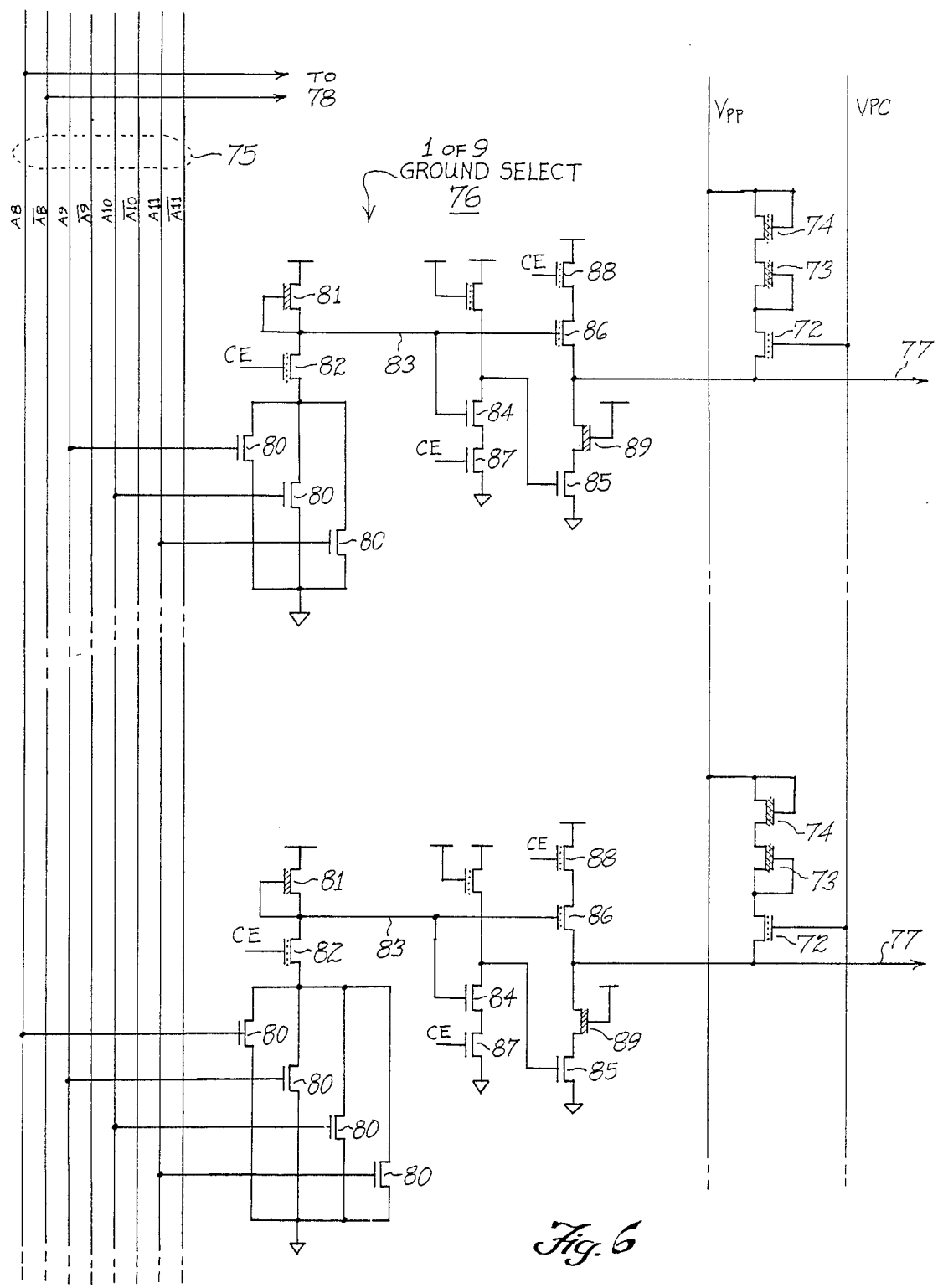
FIG. 6 is an electrical schematic diagram of the decoder used for virtual ground select in the device of FIG. 1.

FIG. 6 shows the decoder 76 in detail. The addresses and complements for bits A8 to A11 from the buffers 30 on lines 75 are used as gate inputs to driver transistors 80 in a set of nine NOR gates, two of which are shown. To select one-of-nine, seven of the NOR gates have three transistors 80 and two have four transistors 80. The NOR gates have depletion loads 81 and a power-down transistor 82 driven by CE in series. An output node 83 is connected to a modified push-pull circuit having an inverter transistor 84 to drive one output transistor 85 and a directly driven low threshold output transistor 86. Transistors 87 and 88 with CE on the gates provide for the power-down mode where all lines 77 will be held low. A transistor 89 provides the same function as the transistors 71 in the row decoder. The circuit for applying high voltage to the selected one-of-nine lines 77 during programming includes three series transistors 72,73,74 as used for the row lines in FIG. 5. In this case, however, the transistor 72 has VPC on its gate rather than VPR.

Figure 7:
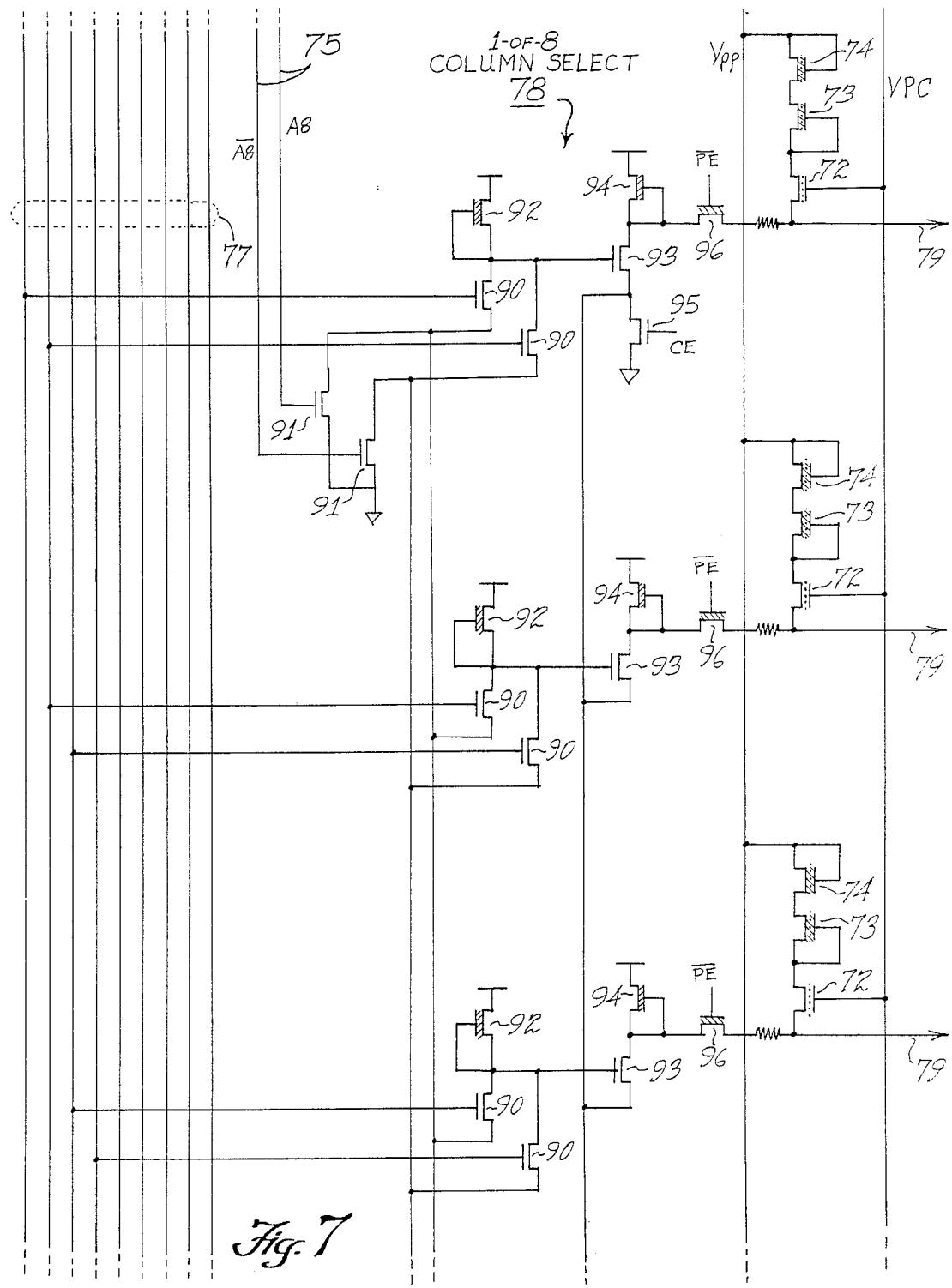
FIG. 7 is an electrical schematic diagram of the column select decoder used in the system of FIG. 1.

In FIG. 7, the selector 78 is shown in detail. Eight four input and/or logic circuits having pairs of input transistors 90 are responsive to the nine ground select lines 77; a pair of transistors 91 common to all eight of these logic circuits is responsive to A8 and $\overline{A8}$ on lines 75. Each logic circuit has a depletion load 92 and drives an output transistor 93. This output stage has a depletion load 94 and a shared power-down gate 95 common to all eight. The column select lines 79 are connected to these output circuits through series transistors 96 having PE on their gates. High voltage for programming is produced by series circuits including transistors 72,73,74 connected to each line 79 as before. The transistors 96 function to isolate the high voltage on the one line 79 which is high, during programming, to prevent the high voltage from being discharged into Vcc through the depletion load 94.

The Cell Array

Figure 8:
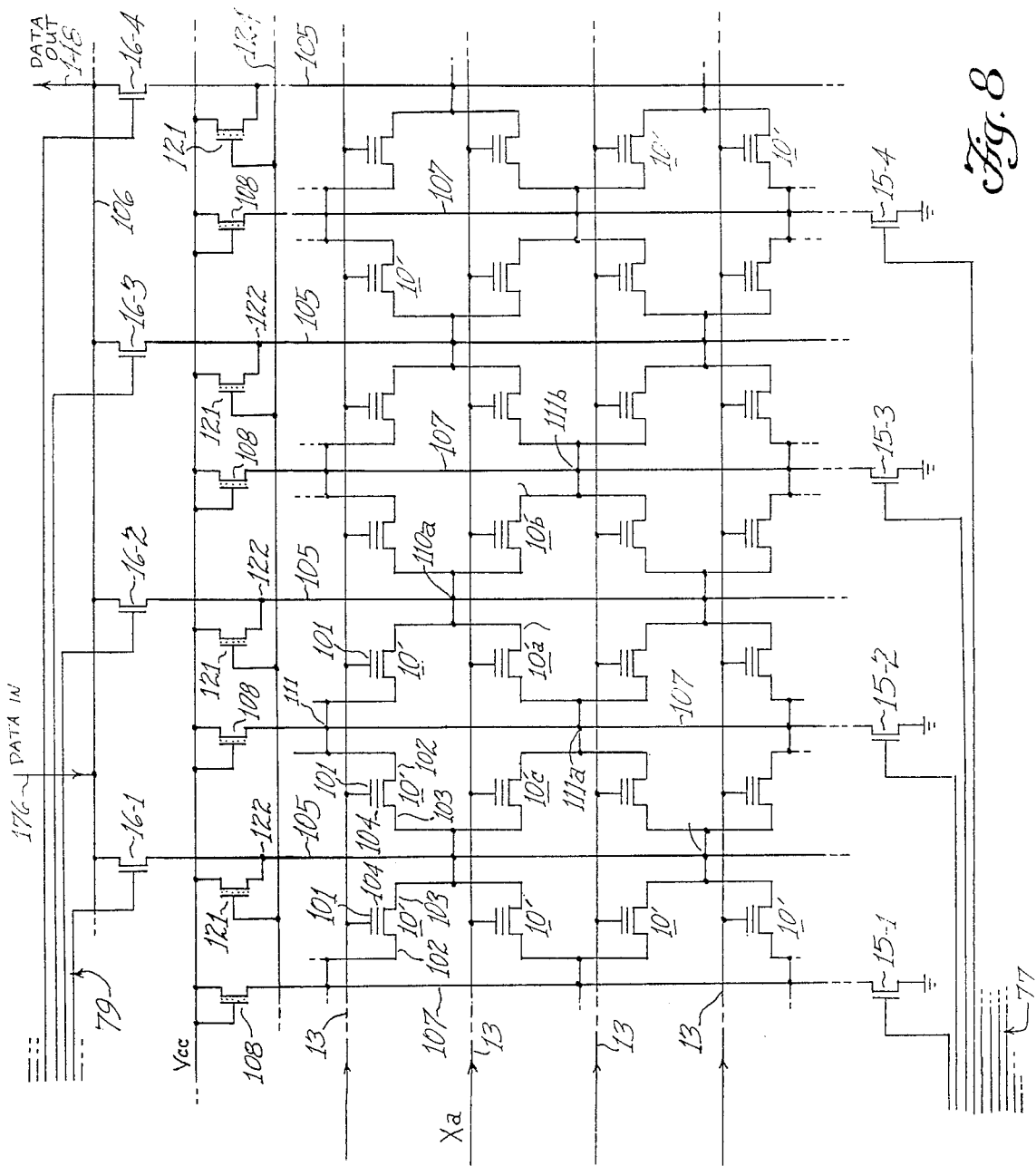
FIG. 8 is an electrical diagram of the cell array in the device of FIG. 1.

Referring to FIG. 8, the cell array 10 is an array of rows and columns of memory cells 10', each of which is an electrically programmable, insulated gate, field effect transistor having a control gate 101, a source 102, a drain 103, and a floating gate 104 between the control gate 101 and the channel between source and drain.

The control gates 101 of all cells in each row are connected to one of a set of row lines or X lines 13. In the example discussed, there are 256 of the lines 13 coming from the X decode circuitry which selects 1-of-256 based on a 8-bit X or row address on lines 12 as discussed above. In a read operation, the selected one of the lines 13 goes high, the othes remain low.

The drains 103 of adjacent cells 10' are connected in common to Y output lines 105; in this example there are sixty-four lines 105 which are partitioned to produce an 8-bit parallel output 11 from the device with each line 105 providing an output of two columns of cells 10', so there are eight groups of sixteen cells per group and each group contains eight of the lines 105. The lines 105 are connected to Vcc through load transistors 121 and to one of eight transistors 16-1 through 16-8 and thus to a Y output line 106 (there would be eight separate lines 106, one for each group sixteen cells wide). The gates of the transistors 16-1,16-2, etc. are connected to receive the column select voltage on lines 79 which function to apply a logic 1 voltage (or Vpp for programming) to one of these gates and hold the others at Vss, based on the four-bit column address on input pins 14. A four-bit address is used to select one-of-16 cells 10' in a group;only the three MSB bits A9–A11 of the four-bit Y address A8–A11 would be needed to select one-of-eight lines, but the LSB address bit A8 is needed due to the virtual ground arrangement.

The sources 102 of adjacent cells 10' are connected in common to another set of column lines 107 which function as ground lines. In each group of sixteen cells 10' nine lines 107 are needed. That is, for an M×N array the number of ground lines is (N/2)+1. Each line 107 is connected through a load device 108 to Vcc, and is also connected through a ground select transistor 15-1,15-2, etc. to ground or Vss. The gates of all of these transistors 15-1, etc., making up the ground select 15 are connected via lines 77 to the selector 76 discussed above. The ground select 76 functions to activate only one of the lines 77 for a given Y address, thus only one of the transistors 15-1,15-2, etc., is conductive.

Figure 9:
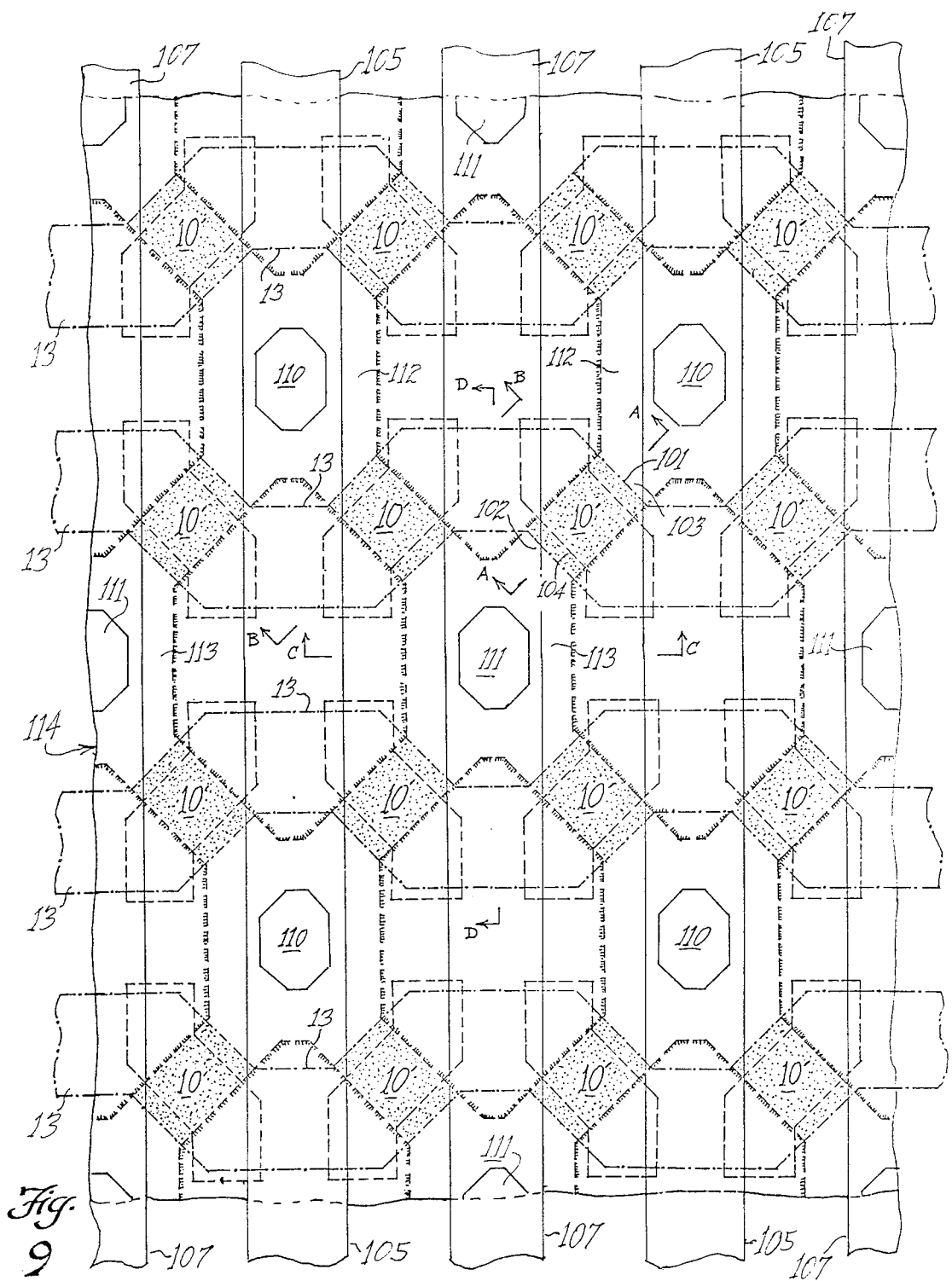
FIG. 9 is a greatly enlarged plan view of a small part of a semiconductor chip showing the physical layout of the cell array in the device of FIG. 1.

A small part of the cell array of FIG. 8 is shown in FIG. 9 which includes sixteen of the cells 10', four of the X address lines 13, and five metal strips which form the Y output lines 105 or ground lines 107. As seen in FIG. 9 and the sectional views of FIGS. 10A–10D, the source and drain regions 102 and 103 are formed by N+ diffused regions in a continuous web of "X" shaped "moat" areas which also include channel regions 109 between each source and drain and contact areas 110 and 111 for metal-to-moat contacts. The metal output lines 105 contact the common N+ regions 112 of the moat at contact areas 110 while the metal ground lines 107 contact common N+ regions 113 of the moat at areas 111. Each of the common regions 112 or 113 forms the sources or drains, respectively, of four of the transistors 10'. The cell array is formed in a face of a silicon bar 114 and a thick field oxide 115 covers all of this face except for the moat areas. P+ channel stop regions 116 underlie all field oxide in the usual manner. Shallow N+ arsenic-implanted regions 102' and 103' act as extensions of the source and drain regions 102 and 103 where the control gates 111 overlap the floating gates 104, and P regions 117 formed by faster diffusing boron produce the programming efficiency advantages which resulted from the conventional P+ tank. A thin layer of gate oxide 118 insulates the floating gate from the channel 109, and a thin oxide layer 119 insulates the floating gate from the control gate 101. A thick layer of deposited interlevel oxide 120 separates the second level polysilicon which forms the X lines 13 and control gates 101 from the metal lines 105 and 107.

The EPROM cells 10' are programmed by applying a high voltage of about +18 V, between a drain 103 and source 102 while holding the control gate of a selected cell at Vpp. High current through the cell causes emission of electrons through the gate oxide 118 to charge the floating gate 104. This functions to increase the threshold voltage of the cell to above Vcc (usually +5 V). The charge on the floating gate will remain indefinitely. Erase is accomplished by exposing the device to ultraviolet light which discharges the floating gates 104.

The select circuitry and the cell matrix must meet certain requirements for proper operation. Programming of a cell requires a voltage of about +18 V on the drain 103 and a source-to-drain current of from 0.5 to 3.0 ma. Reading the EPROM matrix cell requires detecting of currents in the 15 to 60 microamp range.

As an example, for a read operation in the circuit of FIG. 8, Xa (one of the row address lines 13) is high (Vcc-Vt), and transistors 15-2 and 16-2 are turned on by the ground and column selectors. All of the other transistors 15 and 16 are off. The transistor 15-2 must be large enough to pull down the load device 108a for this line, conduct to ground any current through transistors 10'a and 10'c and maintain a very low level of approximately 0.2 to 0.3 volts on the node 111a. The load 108b is needed to charge up the node 111b to a point that the cell 10'b is turned off. This eliminates the need for the sense amplifier 17 connected to the output line 106 to charge the capacitance of the node 111b and beyond. The cell 10'b will turn off with a low voltage on the node 111b due to the body effect of the transistors 10'. The body effect is large due to the P+ region in the channel as used in making these transistors.

To program the cell 10'a, the same transistors 15-2 and 16-2 are turned on (others off) as for a read operation, but this time the on transistors 15-2 and 16-2 have a large positive voltage Vpp on their gates as established in the circuits with transistors 72,73,74 discussed above. The transistor 15-2 must be large enough to hold the node 111a at approximately 0.3 volts and have 1 to 3 ma passing through. The transistor 16-2 will have a large voltage +Vpp on its drain causing a large voltage on the node 110a. The load 108b again charges the node 111b, this time so that the cell 10'b does not program. A voltage of +3 V or more on the node 111b will prohibit the cell 10'b from programming.

Each of the column lines 105 is connected by a load transistor 121 to Vcc; the gates of these load transistors have a reference voltage Rh thereon. The column lines 105 thus act as the output nodes 122 of inverter circuits, and the selected one of such nodes 122 will assume a voltage level dependent on the ratio of the load transistor 121 vs. the selected storage cell 10'. For a programmed cell with floating gate charged the transistor 10' will not conduct, leaving the line 105 (node 122) at its maximum voltage, while an erased cell 10' with floating gate discharged will pull the line 105 to its minimum. A point about halfway between these two extremes will be the reference point for the differential sense amplifiers 17. One input for each of the sense amplifiers 17 is from the nodes 122 via Y select transistors 16-1,16-2, etc. and line 106. The other input is from a reference voltage generator circuit as will be explained.

The Sense Amplifiers and Reference Circuits

Figure 11:
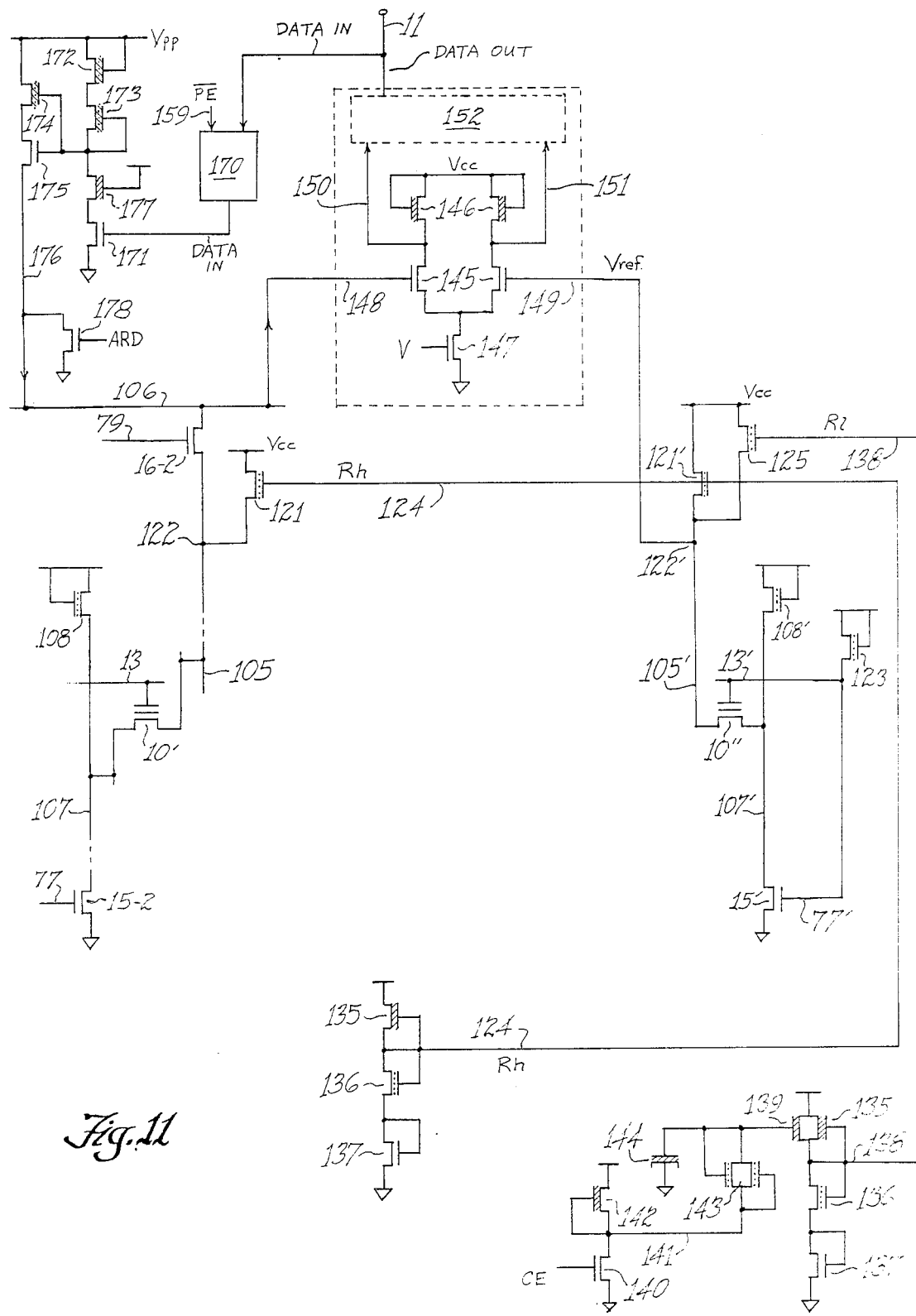
FIG. 11 is an electrical schematic diagram of the sense amplifiers and reference voltage generator in the device of FIG. 1.

Referring now to FIG. 11, the sense amplifiers 17 are shown along with the circuits for generating the reference voltage Rh for use in the loads 121 of the cell array and a voltage Vref for the differential sense amplifier, as well as a reference voltage R1.

The reference voltage Vref used as one input to the sense amplifier 17 is from a circuit which includes an EPROM transistor 10" made like the transistors 10' in the cell array and a load transistor 121' which is like the load transistors 121 (but with a channel width twice as wide to produce a halfway point). A load transistor 108' and a grounding transistor 15' simulate the load 108 and ground device 15-1, etc., for a "virtual ground" column line 107. A voltage on line 77' to the gate of the transistor 15' is about (Vcc-Vt) or the same as a select voltage on one of the lines 77, so the line 107' in the reference generator will exhibit exactly the same voltage, impedance, etc. as a selected line 107 in the array. The transistor 10" has a voltage on its gate (produced by a transistor 123) which is also about (Vcc-Vt) or the same as that on a selected X line 13. Thus, on one side of a node 122' the circuit below the node 122 in the cell array is simulated and the operation will be additional to that of a cell in the array and track all variations due to supply voltage changes, temperatures, aging, process variations in threshold voltage, etc. On the load side, the node 122' is connected to Vcc through two load devices. First, a load transistor 121' is used corresponding to one of the load transistors 121 for the column lines 105 of the array. The transistor 121' has the same reference voltage Rh on its gate as the transistors 121. This reference voltage Rh on line 124 is perhaps about 4 volts for a device having Vcc = +5 v. Rh is selected to optimize the voltage change on the node 122; the voltage drop should be enough to be sensed but not to a full logic level. Second, a load transistor 125 with a different reference voltage R1 on its gate is in parallel with the load transistor 121'.

In a preferred embodiment the load transistor 121' has a channel twice as wide as that of a transistor 121 so its impedance is half as great. Another way of accomplishing the same effect is to place two of the transistors 10" in series instead of one and to use a load transistor 121' equal to 121. Either produces a Vref voltage at node 122' which is half that of the voltage change on node 122 between the program and erase conditions for a selected transistor 10'. Referring to FIG. 11a, at a time 126 the selected X line 13 goes high as seen by a line 127. Depending upon circuit design, the X select voltage may be a full Vcc swing, from Vss to Vcc, or may be less than that, going from Vss to (Vcc-Vt). The voltage on the node 122 as shown by a line 128 stays at a level determined by the Rh voltage shown by the line 129 if the selected cell is programmed (floating gate charged) because the transistor 10' will not turn on. On the other hand, if the selected transistor 10' is erased, the node 122 begins to discharge at a time 130 when the threshold voltage of the transistor 10' is exceeded by the voltage 127 on the selected row line 13. As the voltage 127 continues to increase, the current through the transistor 10' increases and the voltage on the node 122 decreases as seen by the curve 131 until it flattens out at a level dependent upon the Rh level. If Rh is too low, the node 122 would go all the way to the ground, which would be more than necessary and detrimental because the column line would then have to be charged all the way back up. If Rh is too high, the level 128 is too high, near Vcc. Vref is seen to be a level which is halfway between the voltage level 132 (for a programmed transistor 10') and level 133 (the final level of the node 122 for an erased transistor 10').

The function of the second load transistor 125 and the reference voltage R1 is to offset Vref to a level higher than normal level 134 of FIG. 11a during the time the device is in the power-down mode. The reason for this is that in the power-down mode all the row lines 13 and virtual ground selects 77 are at Vss, and so all of the column lines 105 are at their maximum level. Upon exiting from the power-down mode the selected column line 105 may or may not be discharged depending upon the state of the selected cell 10'. If the column line 105 does not discharge (i.e., the selected cell 10' is programmed), valid data is already at the line 106. If the selected line 105 begins to discharge (i.e., the selected cell 10' is erased), the line 106 at the input of the sense amp 17 will not see valid data until the line 105 is pulled below the Vref level. The function of R1 and load 125 is to force Vref higher than normal so that the column line 105, when discharging along curve 131, will cross Vref level 134 earlier in time and thus valid data can be sensed earlier. In the power up condition the load transistor 121' controls Vref; R1 is a d.c. level less than the d.c. level 129 of Rh. Thus, under power up condition, the transistor 125 in the Vref generator is cut off and the Vref level 134 is controlled only by Rh. When the device is in the power down mode, R1 goes higher than Rh level 129 and the load transitor 125 controls, so Vref goes higher. Upon exit from power down, the second load 125 is slowly turned off as R1 goes lower by an RC delay. This slow turn off is necessary to keep Vref from returning to normal too quickly; however, Vref must be near normal level 134 within an access time so that a subsequent cycle sensing a low-to-high column line transition will not be abnormally slow.

The circuits used to generate Rh and R1 are shown in FIG. 11. Rh is a fixed level 129 produced by a divider having three transistors: a depletion load 135, a low-threshold device 136, and an enhancement transistor 137. An output node 124 is the Rh level. A similar set of transistors 135–137 sized differently produces the R1 level on line 138; for power-down a transistor 139 parallel with the transistor 135 is turned on to raise R1 to a higher voltage. To this end, a signal CE goes low, turning off a transistor 140 so node 141 is taken to Vcc by depletion load 142. The MOS diode pair 143 acts as a resistor, and the gate of transistor 139 is held at near Vcc so long as the power-down mode exists. Upon exit from power-down, CEC goes high, node 141 goes low, and the gate of transistor 139 discharges according to the time constant of the RC circuit defined by the "resistor" 143 and an MOS capacitor 144.

The sense amplifier 17 may be any one of many differential type amplifiers which are known to those skilled in the art. For example, a differential amplifier circuit is shown in FIG. 11 which may be used as the same amplifier. This circuit consists of a balanced pair of driver transistors 145 along with depletion load transistors to ground, and this transistor 147 has a bias on its gate to cause it to operate as a current source. One input 148 is connected by the output line 106 to the node 122 on the selected column line 105, and the other input 149 is connected to the node 122', i.e., the Vref voltage. The outputs 150 and 151 will tend to go toward Vcc or Vss depending upon the polarity of the difference between the voltages on the inputs 148 and 149. Usually several stages of the circuit seen in FIG. 11 would be cascaded to form a high gain sense amplifier; that is, the outputs 150 and 151 are connected to the inputs 148 and 149 of the next stage 152, and so on. The final output 11 is to be one of the lines 150 or 151 of the last stage, which would exhibit a full logic level swing.

It is important to note that the differential sense amplifier is sensing voltage, not current. The voltage on the nodes 122 or 122' need only charge the gates of the input transistors 145; there is no significant current loading except this transient. Thus, no voltage drop occurs across the Y select transistors 16-2, or other decode transistors if a different selection scheme is used.

All of the lines 105 are charged through the loads 121, and all ground lines 107 are charged through the loads 108. Only the selected column lines 105 are discharged during a read cycle, and these not always to ground. In the power-down condition, all of the X select lines 13 are grounded and all of the ground select lines 77 are grounded, so there is no discharge of the column lines 105, and no d.c. power dissipation. All column lines 105 are held at their bias point 128 of FIG. 11a, so upon exiting from power-down there is no delay while precharging the array. The access time upon coming out of power-down should be the same as in normal operation.

Programming the Array

It is characteristic of the floating gate device 10' that it will program only if it is operated in its saturated region at sufficiently high drain 103 and gate 101 voltages. A device in its linear mode will not program. When applying the programming voltages to the virtual ground array, care must be taken that only the selected device 10' to be programmed receives sufficiently high voltage that it is in the saturated region.

Figure 12:
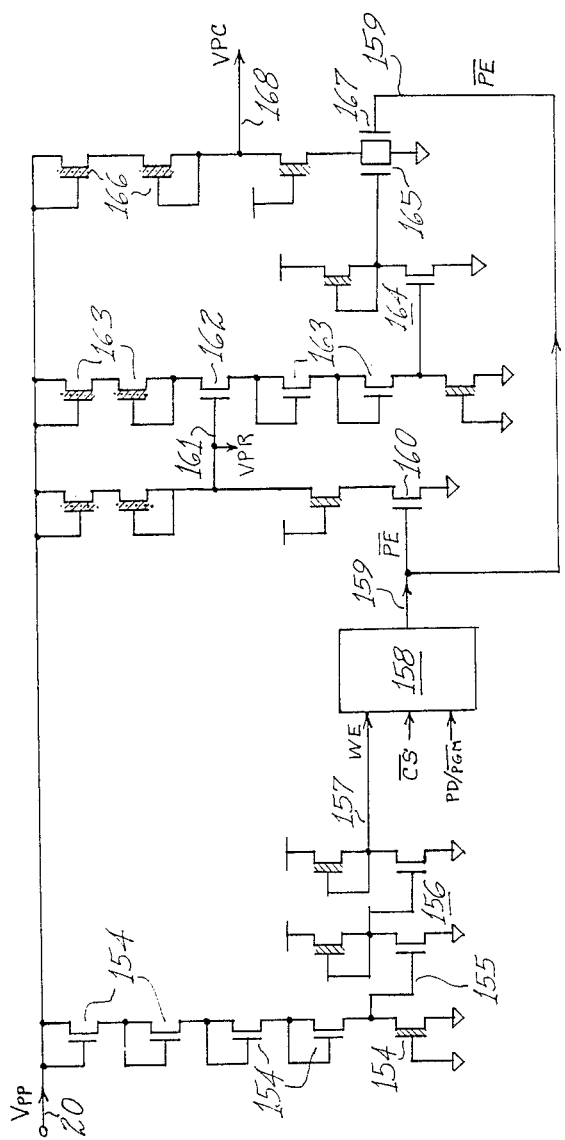

Referring to FIG. 12, the high voltage programming control circuits are shown in schematic diagram form. When Vpp on pin 20 goes to its high voltage level of about +21 V, a voltage divider made up of five transistors 154 produces a voltage on a node 155 which will switch two inverters 156 to produce a write enable commnd WE on line 157. Thus, if Vpp is low, WE is low; if Vpp is at its high level, WE is high. Also a $\overline{WE}$ command is produced by another inverter. A logic circuit 158 receives the WE (or $\overline{WE}$) command along with the chip select $\overline{CS}$ and power-down/program PD/$\overline{PGM}$ commands from pins 21 and 22 and in response thereto produces a program enable command $\overline{PE}$ in line 159. The program enable command is active low when Vpp is high and both $\overline{CS}$ and PD/$\overline{PGM}$ are logic 0; if either or both of the pins 21 and 22 is high, a program inhibit condition exists, and $\overline{PE}$ is high. A transistor 160 receives the PE command on is gate, and along with its series loads produces an output on the node 161 which is the VPR command used on the high voltage circuits for the row address outputs 13 in FIG.

5. Thus, when $\overline{PE}$ is low, node 161 goes to near Npp and turns on all the 256 transistors 72 for the 256 row lines 13. Also, node 161 drives the gate of a transistor 162 in series with four transistors 163 in a voltage divider which, with an inverter 164, produces a voltage on the gate of a transistor 165 to produce VPC. Natural depletion transistors 166 in series with the transistor 165 and with its short transistor 167 produce a voltage on the node 168 which is high, near Vpp, when $\overline{PE}$ is low and a slight delay has occurred since VPR went high. VPC is applied to each of the transistors 72 for the high voltage circuits for all of the lines 77 and 79 for the ground select and column output select as seen in FIGS. 6 and 7.

In FIG. 11 the programming circuit for applying a high voltage input data bit to the selected column line 105 is illustrated. Each of the eight pins 11 is connected to one of eight separate data-in buffers 170 which are enabled only when $\overline{PE}$ on line 159 is low. The output of a buffer 170 is connected to its respective line 106 by a high voltage circuit including an inverter stage having a driver transistor 171 with two series loads 172,173, producing a high voltage on the gates of transistors 174,175 when the data-in bit is low. This allows the Vpp voltage to be applied to the line 106 via line 176. A transistor 177 in the high voltage circuit functions like the transistors 71 above. A transistor 178 connects the line 176 to ground when an array discharge command ARD is high.

In operation, the programming circuits function to apply high voltage to only one cell in each group when in the programming mode, but no high voltage in any other mode. Vpp may be held high so that this high voltage need not be switched rapidly by the external circuits as this would require more costly circuitry and would generate undesirable transients. With the device deselected (or in the power-down mode) the command $\overline{PE}$ on node 159 is high, holding VPR and VPC at ground via transistors 160 and 167. If the high voltage supply is then brought up from its low state to its high state Vpp, this high voltage is sensed at the node 155 and WE is produced. Vpp stays high for the duration of the programming sequence. Now when the device is selected (or powered up) by $\overline{CS}$ and PD/$\overline{PGM}$ going low, with WE high, the programming mode is entered, and $\overline{PE}$ goes low. Prior to VPR going high, all of the column lines 105 and virtual ground lines 107 are at their normal bias of near Vcc due to the load transistors 108 and 121, except the selected lines. The selected row line 13 is at Vcc, but all the cells 10' on this line are in triode operation and no programming can take place even though a data-in bit is low and line 106 charges high via line 176. The select transistor 16-2, etc., has only Vcc on its gate so it will not allow a voltage near Vpp to reach the line 105. Now, the VPR command on the node 161 begins to charge toward the Vpp level through its depletion loads while VPC is held at ground by transistor 165. As VPR on node 161 rises above about 10 V the timing circuit 162-164 begins to release VPC. It takes about 10 μs for VPR to reach Vpp; the delay before VPC begins to change after VPR starts up is about 1.5 μs. The selected row line 13 reaches programming voltage before the select column line 105 does, so the sourcedrain paths of all of the transistors 10' in the selected row become highly conductive (whether their floating gates are previously charged or not) and an equilibrium charge-shared state is reached before one column goes high. Then, assuming data-in is low or logic 0, when VPC goes to near Vpp high voltage appears on the selected line 79, allowing high voltage from the line 106 to reach the selected line 105. As this selected line 105 voltage rises toward Vpp the adjacent unselected column lines 105 and virtual ground lines Vpp on one side pulled up due to the high voltage on the control gates on line 13. However, only the selected cell 10a' will saturate with sufficient voltage to program; the cell 10b' on the other side of the selected column line 105 from the selected cell 10a' will also saturate but will have such a large voltage on its source node 111b that it cannot conduct enough to program. On the side, the cell 10c' has its source grounded at node 111 via transistor 15-2, and its gate is at Vpp via line 13, but its drain is only at near Vcc via load 121, so this cell will not program. While VPR and VPC stay high, which may be up to 50 ms, there would be a tendency toward deprogramming through the interlevel oxide 119; this tendency is greatly reduced because the voltage across this oxide is kept low in all but the cell 10c' in a given row due to the charging up of all the nodes 111 (except selected node 111a). The reduced deprogramming effect is because only one line 107 is grounded so other nodes can charge up and reduce the gate to source or drain voltage in cells other than the selected cell 10a'. After the selected cell is held at programming voltages for sufficient time (perhaps 10 to 50 ms) the PD/$\overline{PGM}$ (or $\overline{CS}$) voltage goes high and $\overline{PE}$ goes high, turning on transistors 160 and 167 so VPR and VPC go low. At this point, the high voltage on the selected column line 105 must be removed carefully; if the large array capacitance is discharged through a storage cell it would produce programming in unselected cells. To this end, the bleeder transistor 178 provides a path for removing the excess voltage from the column lines via the select transistors 16-2, etc., and common line 106. Any excess voltage on the virtual ground lines 107 does not represent a parasitic programming hazard due to the bias on the column lines. The array discharge voltage ARD is essentially the complement of PD/$\overline{PGM}$, but only occurs when Vpp is high, so it occurs in the program inhibit mode of operation. The device powers down during program inhibit.

Manufacturing Process

The semiconductor device including all of the system of FIG. 1 is made by a double-level polysilicon,N-channel,self-aligned process generally as described in the above-identified U.S. Pat. Nos. 4,112,509 or 4,112,544, advantageously employing a double-diffusion step to produce the programming enhancement P+ regions as set forth in pending application Ser. No. 072,504, filed Sept. 4, 1979, now U.S. Pat. No. 4,376,947 issued Mar. 15, 1983, assigned to Texas Instruments.

The standard enchancement mode MOS transistors (40,41,49, etc., in FIG. 5 et seq.) produced in the process used have a threshold voltage of about +0.8 to +1.0 V, assuming a +5 V value of Vcc, and this threshold is the result of a blanket boron implant of conventional type with the natural transistors being protected by photoresist. The natural transistors (45, 48,54,etc.) are unimplanted and have a threshold of about +0.2 to +0.3 V, producing a lower source-to-drain voltage drop which is advantageous in many parts of the circuits illustrated. The third type of transistor is the standard depletion transistor (such as 42,47,50,etc.) which is implanted with the blanket boron implant for the standard enhancement devices but then receives a selective N-type implant which produces a threshold of about −3.4 V. The fourth type is a "natural depletion" device which receives the N-type implant but not the boron implant so it has a threshold of about −3.8 to −4.0 V; these devices are used as transistors 73,74 in the high voltage circuits, for example.

CONCLUSION

The decoding circuits described above may be used in memory devices of other types such as read-only memories or read/write memories, rather than merely in EPROM's. Likewise, the sensing circuits and power-down features, as well as the input buffers, are useful in other types of devices.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A one-of-($N \times V$) decoder formed in a single semiconductor integrated circuit for addressing $N \times V$ rows of a semiconductor memory array or the like within said integrated circuit, comprising:

buffer means for receiving M address bits from external to the integrated circuit and producing complements thereof, where $2^M = N \times V$;

a plurality of T predecode means each receiving from said buffer means a subset of R of said M address bits and complements thereof and each producing a one-of-S output, where T is an integer and $S = 2^R$;

and decoder means having N logic circuits with each logic circuit having T inputs, where $N \times T$ is much less than $N \times M$; wherein each of said T inputs of said N loic circuits includes a transistor and the total number of such transistors is much less than $(N \times V) \times M$; the decoder means producing an output on one-of-N separate output lines;

each of the N output lines of the decoder being connected to a one-of-V multiplexer, where V is an integral power of 2, to produce a one-of-($N \times V$) output to rows of the array, each said multiplexer receiving from said buffer means U address bits and complements thereof, where $2^U = V$.

2. Apparatus for selecting one out of N lines in a semiconductor memory array in response to an address of A bits, where N is a power of 2 greater than $2^5$, said apparatus and memory array both being formed in a single semiconductor integrated circuit, comprising:

means for detecting each of said A address bits received from external to said integrated circuit and producing a pair of true and complement address signals for each of said A address bits;

means connected to receive the address signals for predecoding the address by converting sets of said pairs of true and complement address signals to sets of one-of-($2^B$) select signals, where B is a small integral power of 2;

a plurality of N/M multiplex circuits, where M is a power of 2 no greater than $2^3$;

a one-of-(N/M) decoder;

means for applying a first of said sets of select signals to all of said multiplex circuits, each multiplex circuit having M output lines which are part of said N output lines of the array, and means for applying the remaining sets of select signals to inputs of said one-of-(N/M) decoder, the decoder having N/M outputs each connected separately to an input of one of said multiplex circuits, wherein each of said inputs of said one-of-(N/M) decoder includes a transistor, and the number of said inputs is many times smaller than $N \times A$.

3. Apparatus according to claim 2 wherein $M = B$.

4. Address decoding circuitry formed in a semiconductor integrated circuit comprising:

a first buffer circuit for receiving a first address bit and producing first and second true address voltages of the same logic state at first and second true outputs, first power-down means. connected in series between said first and second true outputs for introducing a voltage differential, said first buffer circuit also producing first and second complement address voltages of the same logic state at first and second complement outputs, second power-down means connected in series between said first and second complement outputs for introducing a voltage differential, a second buffer circuit for receiving a second address bit and producing third and fourth true address voltages of the same logic state at third and fourth true outputs, third power-down means connected in series between said third and fourth true outputs for introducing a voltage differential, said second buffer circuit also producing third and fourth complement address voltages of the same logic state at third and fourth complement outputs, fourth power-down means connected in series between said third and fourth complement outputs for introducing a voltage differential, a decode logic circuit having a first plurality of input devices conected between a voltage supply and output nodes and a second plurality of input devices connected between output nodes and reference potential, the first input devices being conected to said first and third true outputs to receive said first and third true address voltages and connected to said first and third complement outputs to receive said first and third complement address voltages, the second input devices being connected to said second and fourth true outputs to receive said second and fourth true address voltages and connected to said second and fourth complement outputs to receive said second and fourth complement address voltages, and means to apply either an operating voltage or a power-down voltage to said first, second, third and fourth power-down means to define an operating condition in which such voltage differentials are not present or a power-down condition in which such voltage differentials are present.

5. Circuitry according to claim 4 wherein said logic circuit is an AND/OR circuit producing a one-of-N decode function, where N is a power of 2.

6. Circuitry according to claim 4 wherein said input devices are insulated gate field-effect transistors.

7. A decoder according to claim 1 including means in said logic circuits for establishing a low-power condition in which none of said transistors in said logic inputs of the decoder means is allowed to conduct regardless of the state of said address bits.

8. A decoder according to claim 1 including logic circuitry in said predecode means for receiving said address bits and complements and establishing a low-power condition in which none of such logic circuitry conducts static current to ground regardless of the state of said address bits.

9. A transistor circuit having a first input terminal, a second input terminal, and a circuit enable terminal, said circuit comprising:
(a) a depletion-mode MOS transistor having a source, a drain, and a gate, the latter gate being connected to said first input terminal;
(b) an enhancement-mode MOS transistor having a drain, a source, and a gate, the latter gate being connected to said second input terminal; and
(c) an MOS transistor connected between said depletion-mode transistor and said enhancement-mode transistor for providing a power-down function, said power-down function transistor having a threshold voltage of approximately zero volts and also having a drain connected to said source of said depletion-mode MOS transistor, a source connected to said drain of said enhancement-mode transistor, and a gate connected to said circuit enable terminal.

10. The transistor circuit in claim 9, wherein said depletion-mode MOS transistor is a load transistor and said enhancement-mode MOS transistor is a drive transistor.

11. The transistor circuit in claim 9, wherein a chip select signal is inputted to said circuit enable terminal for enabling or powering-down said circuit.

12. The transistor circuit in claim 9, wherein an output terminal is connected to said drain of said enhancement-mode MOS transistor.

13. The transistor circuit in claim 9 further including a power supply having at least two terminals wherein said drain of said depletion-mode MOS transistor is connected to a first terminal of said power supply and said source of said enhancement-mode MOS transistor is connected to a second terminal of said power supply.

14. The transistor circuit in claim 13 wherein said first terminal of said power supply is at a more positive potential than is said second terminal.

15. The transistor circuit of claim 9 wherein said first input terminal is an inverted signal input terminal and wherein a first output terminal is connected to said drain of said enhancement-mode transistor.

16. The transistor circuit in claim 15 further including a second output terminal connected to said drain of said power-down function MOS transistor.

* * * * *